(12) United States Patent
Huang et al.

(10) Patent No.: US 7,701,040 B2
(45) Date of Patent: Apr. 20, 2010

(54) SEMICONDUCTOR PACKAGE AND METHOD OF REDUCING ELECTROMAGNETIC INTERFERENCE BETWEEN DEVICES

(75) Inventors: Rui Huang, Singapore (SG); Yaojian Lin, Singapore (SG); Seng Guan Chow, Singapore (SG)

(73) Assignee: STATS ChipPAC, Ltd. (SG)

( * ) Notice: Subject to any disclaimer, the term of this patent is extended or adjusted under 35 U.S.C. 154(b) by 242 days.

(21) Appl. No.: 11/860,377

(22) Filed: Sep. 24, 2007

(65) Prior Publication Data
US 2009/0079041 A1      Mar. 26, 2009

(51) Int. Cl.
*H01L 23/552*       (2006.01)
(52) U.S. Cl. ................. 257/659; 257/E23.114
(58) Field of Classification Search ............ 257/659, 257/660, 725, E23.114; 438/110
See application file for complete search history.

(56) References Cited

U.S. PATENT DOCUMENTS

| | | | |
|---|---|---|---|
| 6,677,572 B2 * | 1/2004 | Ishii et al. | 250/214.1 |
| 6,838,748 B2 | 1/2005 | Ishio et al. | |
| 7,125,744 B2 | 10/2006 | Takehara et al. | |
| 7,187,060 B2 | 3/2007 | Usui | |
| 7,411,278 B2 * | 8/2008 | Wen et al. | 257/659 |
| 2008/0315371 A1 * | 12/2008 | Tang et al. | 257/659 |

* cited by examiner

*Primary Examiner*—Mark Prenty
(74) *Attorney, Agent, or Firm*—Robert D. Atkins

(57) ABSTRACT

A wafer level semiconductor package has a substrate and an RF module and baseband module coupled to the substrate with solder bumps. An underfill material is disposed under the RF module and baseband module. A first shielding layer is applied to a first surface of the substrate. A seed layer is deposited on the substrate and RF module and baseband module. A second shielding layer is plated over the seed layer, except over the contact pads on the substrate. The second shielding layer can be made from copper, gold, nickel, or aluminum. The first and second shielding layers substantially cover the wafer level semiconductor package to isolate the baseband module from electromagnetic interference generated by the RF module. The first and second shielding layers are grounded through the substrate.

21 Claims, 5 Drawing Sheets

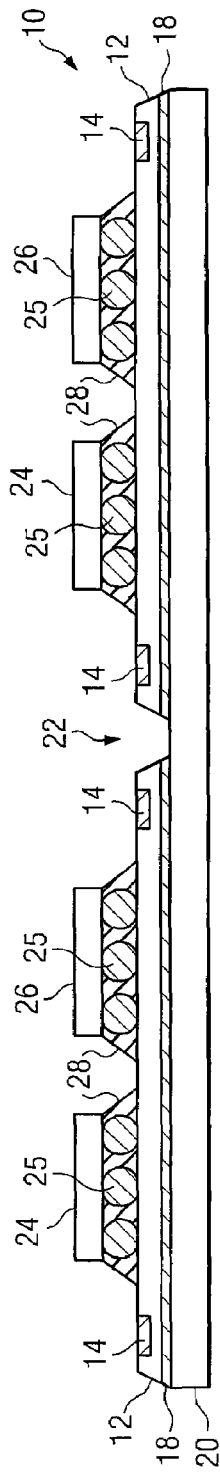
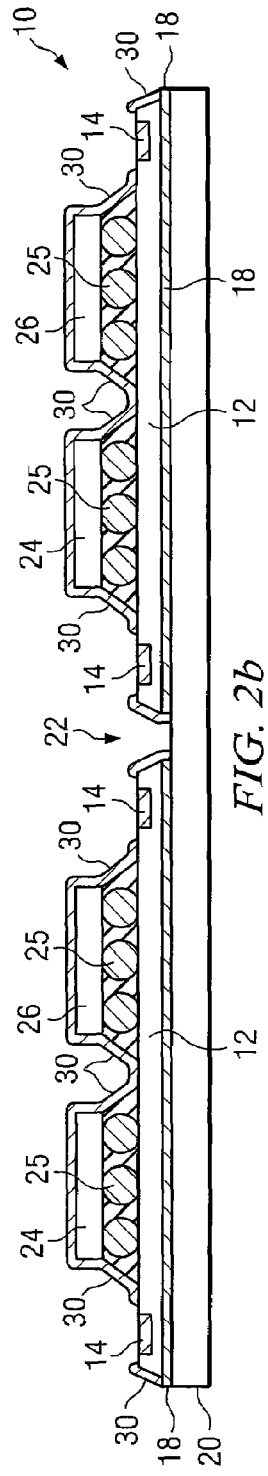
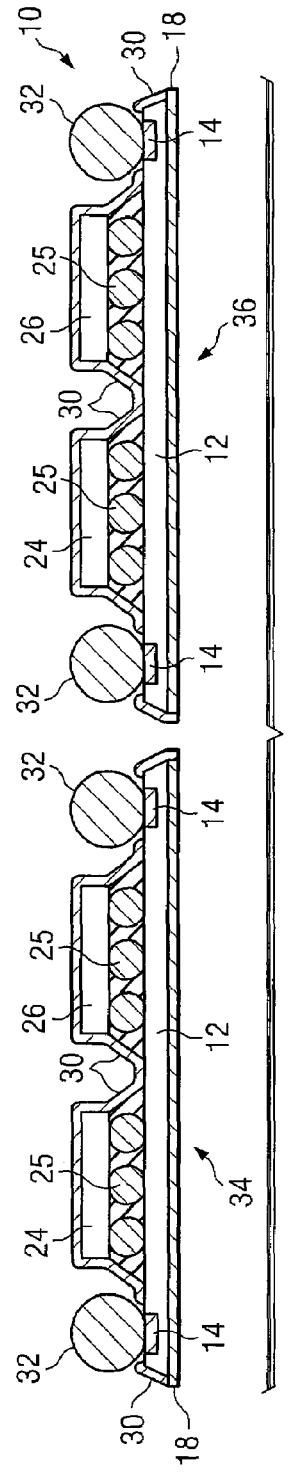
FIG. 2a
FIG. 2b
FIG. 2c

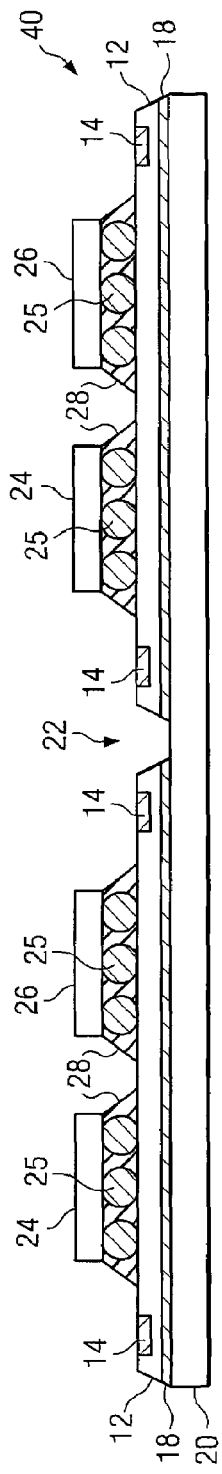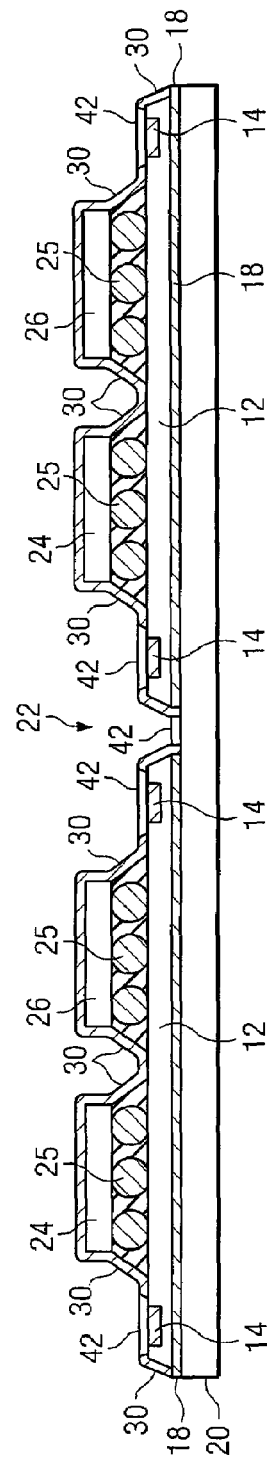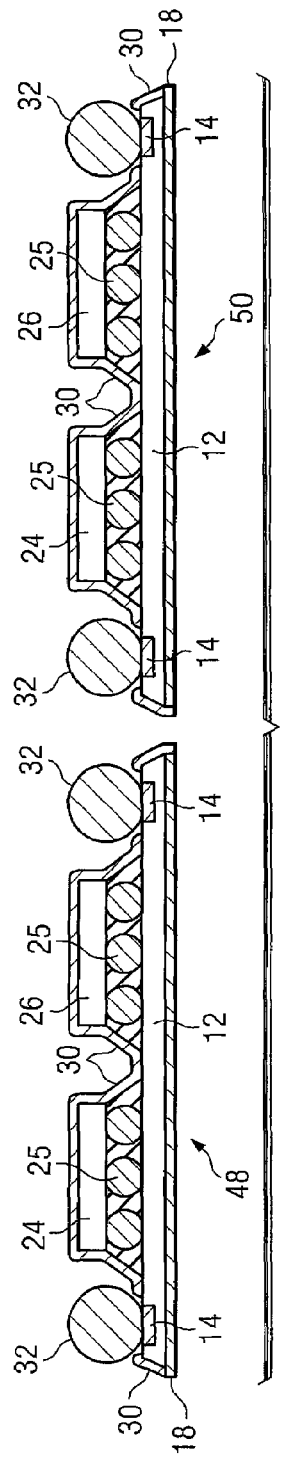

SEMICONDUCTOR PACKAGE AND METHOD OF REDUCING ELECTROMAGNETIC INTERFERENCE BETWEEN DEVICES

FIELD OF THE INVENTION

The present invention relates in general to semiconductor packaging and, more particularly, to a semiconductor package which reduces electromagnetic interference between semiconductor devices.

BACKGROUND OF THE INVENTION

Semiconductor devices are found in many products used in modern society. Semiconductors find applications in consumer items such as entertainment, communications, networks, computers, cellular phones, two-way pagers, laptop computers, personal digital assistants (PDAs), and music players. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

Some integrated circuit packages are hybrids containing radio frequency (RF) circuits and baseband circuits in a single package. Certain RF components, such as inductors, operate at very high frequencies and emit electromagnetic energy that can interfere with the operation of the baseband circuits, as well as other RF devices. To block or isolate the electromagnetic interference (EMI), the semiconductor packages found in the prior art have used shielding or insulating film in leaded or ball grid array (BGA) packages, such as found in U.S. Pat. Nos. 6,838,748, 7,125,744, and 7,187,060. However, these prior art designs typically provide only partial shielding, which limits the effectiveness of any EMI isolation.

Furthermore, with the growing demand for higher circuit integration, the space efficiencies and electrical and thermal performance of wafer level packages (WLP) and flip chip packages make these packages ever more popular. Yet, because of their unique layout and structure, there are few practical EMI solutions for hybrid WLP or flip chip packages.

A need exists for an effective EMI solution for WLP and flip chip packages containing RF and baseband circuits.

SUMMARY OF THE INVENTION

In one embodiment, the present invention is a wafer level semiconductor package comprising a substrate and a first shielding layer applied to a first surface of the substrate. An RF module is mounted to a first area on a second surface of the substrate opposite the first surface with a plurality of solder bumps. A baseband module is mounted to a second area on the second surface of the substrate with a plurality of solder bumps. A second shielding layer covers the second surface of the substrate and RF module and baseband module. The first and second shielding layers substantially cover the wafer level semiconductor package to isolate the baseband module from electromagnetic interference generated by the RF module.

In another embodiment, the present invention is semiconductor package comprising a substrate. A first electronic module is mounted on a first surface of the substrate. A second electronic module is mounted on the first surface of the substrate. A first shielding layer covers the first surface of the substrate and first and second electronic modules. A second shielding layer is applied to a second surface of the substrate which is opposite the first surface. The first and second shielding layers substantially cover the semiconductor package to isolate the second electronic module from electromagnetic interference generated by the first electronic module.

In another embodiment, the present invention is a semiconductor package comprising a substrate. A first electronic module is mounted on a first surface of the substrate. A second electronic module is mounted on the first surface of the substrate. A shielding layer substantially covers the substrate and first and second electronic modules.

In another embodiment, the present invention is a method of making a semiconductor package comprising the steps of forming a substrate, mounting an RF module on a first surface of the substrate, mounting a baseband module on the first surface of the substrate, and forming a first shielding layer covering the first surface of the substrate and RF module and baseband module to isolate the baseband module from electromagnetic interference generated by the RF module.

BRIEF DESCRIPTION OF THE DRAWINGS

FIGS. 2a-2c illustrate later stages of formation of the WLP with EMI shielding;

FIGS. 3a-3c illustrate later stages of formation of the WLP with a photoresist layer on the contact pads;

DETAILED DESCRIPTION OF THE DRAWINGS

Figure 1A:
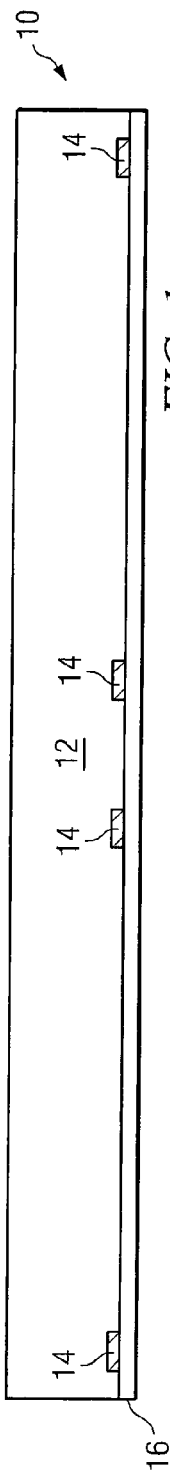
FIGS. 1a-1d illustrate initial stages of formation of a WLP.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation. The active surface is substantially planar and uniform with electrical interconnects.

Some semiconductor packages contain baseband circuits for baseband signal processing. Examples of a baseband circuit includes a microprocessor, analog to digital converter, digital to analog converter, memory, control logic, and analog amplifier. Other semiconductor packages contain radio frequency (RF) circuits for RF signal processing. The RF circuit may include an RF amplifier stage, modulator, demodulator, and oscillator. In one embodiment, the RF signal processing circuit receives RF signals, downconverts, and demodulates the signals to baseband signals. The baseband signal processing performs amplification, signal conversion, storage, and control of the baseband signals.

In some applications, such as cellular phones and wireless computer networking, both RF circuits and baseband circuits are required to perform all necessary electrical functions. Due to demand for integration, the RF circuits and baseband circuits are sometimes contained in a single hybrid semiconductor package. However, it is necessary to isolate the baseband circuit from the RF circuits because the RF devices emit electromagnetic interference (EMI) or electromagnetic waves (EMW), which can adversely affect the operation of the baseband circuit.

A popular semiconductor package style is the wafer level package (WLP) or flip chip package. The WLP and flip chip packages are commonly used with integrated circuits (ICs) demanding high speed, high density, and greater pin count. The WLP involves mounting an active area of a die face down toward a chip carrier substrate or printed circuit board (PCB). The active area contains active and passive devices, conductive layers, and dielectric layers according to the electrical design of the die. In one die, the active and passive devices are designated for RF signal processing. In another die, the active and passive devices are designated for baseband signal processing. The electrical and mechanical interconnect is achieved through a solder bump structure comprising a large number of individual conductive solder bumps or balls. Alternatively, the interconnect can be made with copper bumps or gold bumps. The solder bumps are formed on bump pads which are disposed on the active area. The bump pads connect to the active circuits by conduction tracks in the active area of the die. The solder bumps are electrically connected to contact pads on the carrier substrate by a solder reflow process. The flip chip semiconductor package provides a short electrical conduction path from the active devices on the die to conduction tracks on the carrier substrate in order to reduce signal propagation, lower capacitance, and achieve overall better circuit performance.

FIGS. 1a-1d illustrate cross-sectional views of the initial formation of WLP package 10. In FIG. 1a, metal contact pads 14 are formed on silicon wafer substrate 12. Contact pad 14 is made of aluminum, copper, or aluminum/copper alloys. Contact pad 14 is electrically connected to conduction tracks or layers formed on substrate 12. Substrate 12 may also include active devices, passive devices, and redistribution lines. A solder bump or wire bond will later be formed on the metal contact pad. Backgrind tape 16 is attached to the contact pad side of substrate 12.

Figure 1B:
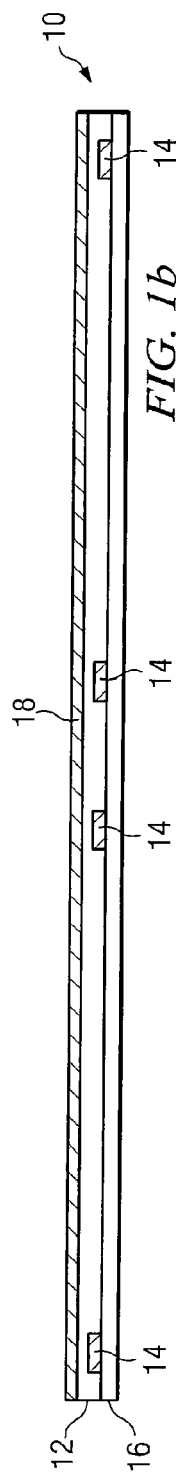

In FIG. 1b, the backside of substrate 12, opposite the contact pad side, undergoes a backgrinding process to remove excess bulk semiconductor material and reduce the substrate to a desired thickness. In one embodiment, substrate 12 is made to have a thickness of 50-750 microns (μm). A metal shielding layer 18 is deposited on the backside of substrate 12 by electrolytic plating or electroless plating. Shielding layer 18 is made from copper, gold, nickel, aluminum, or other conductive material having EMI shielding properties. Alternatively, shielding layer 18 can be a metal foil or film applied with an adhesive layer to the backside of substrate 12. Shielding layer 18 can also be made from conductive resin or epoxy.

Figure 1C:
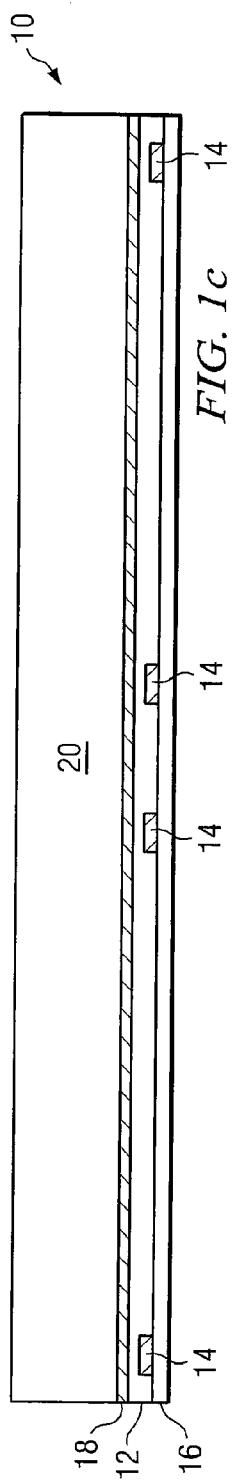

In FIG. 1c, wafer jig 20 is attached to the backside of substrate 12 with an adhesive layer. Wafer jig 20 can be made from glass, silicon, ceramic, heat resistant tape, or other material having a coefficient of thermal expansion matching that of substrate 12.

Figure 1D:
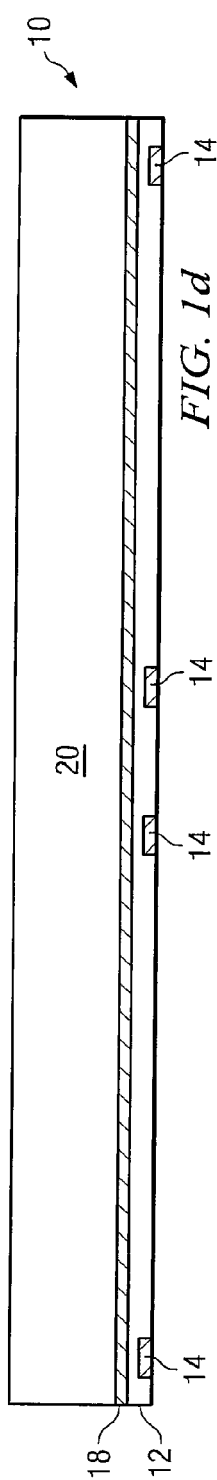

In FIG. 1d, backgrind tape 16 is removed to expose the contact pad side of substrate 12.

The WLP 10 is inverted in FIGS. 2a-2c such that the contact pad side of substrate 12 is facing up. In FIG. 2a, notch 22 is formed along scribe lines by sawing or etching substrate 12. RF modules or die 24 are attached to a first area of substrate 12 with a plurality of solder balls or bumps 25, e.g., using a flip chip interconnect reflow process. The interconnect can also be made with copper bumps or gold bumps. Similarly, baseband modules or die 26 are attached to a second area of substrate 12 with a plurality of solder balls or bumps 25. Underfill material 28 is disposed under RF modules 24 and baseband modules 26. The underfill material 28 can be made with epoxy, polymeric material, film, or other non-conductive material.

In FIG. 2b, a platinum (Pt) seed layer is plated on substrate 12, including notch 22, and further on the backside of RF modules 24 and baseband modules 26, i.e., opposite the solder bump side which attaches to substrate 12. A shielding layer 30 is deposited on the seed layer by electrolytic plating or electroless plating. Shielding layer 30 is made from copper, gold, nickel, aluminum, or other conductive material having EMI shielding properties. Shielding layer 30 can also be made from conductive resin or epoxy. Shielding layer 30 follows the contour of substrate 12, RF modules 24, notch 22, and baseband modules 26. However, the plating pattern does not cover contact pads 14, leaving these areas exposed. Shielding layer 30 is formed to join with shielding layer 18 to substantially enclose WLP 10, i.e., substrate 12, RF modules 24, and baseband modules 26, less contact pads 14.

In FIG. 2c, solder balls or bumps 32 are formed on contact pads 14. The wafer is singulated by removing wafer jig 20. WLP 34 contains one RF module 24 and baseband module 26, while WLP 36 contains another RF module 24 and baseband module 26. WLPs 34 and 36 are each substantially surrounded on all sides by shielding layer 30 and shielding layer 18 to isolate baseband module 26 from the EMI effects from RF module 24. The shielding layers absorb and reflect incident EMI generated by RF module 24. The shielding layers 18 and 30 also function as a heat sink to dissipate heat from RF module 24 and baseband module 26 to improve the thermal performance of WLP 10.

An alternate embodiment of masking contact pads 14 is shown in FIGS. 3a-3c. An initial formation of WLP 40 follows the steps described in FIGS. 1a-1d, providing substrate 12, contact pads 14, shielding layer 18, and wafer jig 20. Again, the contact pad side of substrate 12 is facing up. In FIG. 3a, notch 22 is formed along scribe lines by sawing or etching substrate 12. RF modules or die 24 are attached to a first area of substrate 12 with a plurality of solder balls or bumps 25, e.g., using a flip chip interconnect reflow process. Similarly, baseband modules or die 26 are attached to a second area of substrate 12 with a plurality of solder balls or bumps 25. Underfill material 28 is disposed under RF modules 24 and baseband modules 26. The underfill material 28 can be made with epoxy, polymeric material, film, or other non-conductive material.

In FIG. 3b, a photoresist layer 42 is deposited and patterned over contact pads 14 to isolate the contact pads from the subsequent shielding layer. A seed layer is applied on substrate 12, including notch 22, and further on the backside of RF modules 24 and baseband modules 26, i.e., opposite the solder ball side which attaches to substrate 12, by plating or sputtering process. The seed layer can be made with Pt, titanium/copper (Ti/Cu), or titanium tungsten (TiW). A shielding layer 30 is deposited on the seed layer by electrolytic plating or electroless plating. Shielding layer 30 is made from copper, gold, nickel, aluminum, or other conductive material having EMI shielding properties. Shielding layer 30 can also be made from conductive resin or epoxy. Shielding layer 30 follows the contour of substrate 12, RF modules 24, notch 22, and baseband modules 26. Photoresist layer 42 is removed to expose contact pads 14. Shielding layer 30 is formed to join with shielding layer 18 to substantially enclose WLP 10, i.e., substrate 12, RF modules 24, and baseband modules 26, less contact pads 14.

In FIG. 3c, solder balls or bumps 32 are formed on contact pads 14. The wafer is singulated by removing wafer jig 20. WLP 48 contains one RF module 24 and baseband module 26, while WLP 50 contains another RF module 24 and baseband module 26. WLPs 48 and 50 are each substantially surrounded on all sides by shielding layer 30 and shielding layer 18 to isolate baseband module 26 from the EMI effects from RF module 24. The shielding layers absorb and reflect incident EMI generated by RF module 24. The shielding layers 18 and 30 also function as a heat sink to dissipate heat from RF module 24 and baseband module 26 to improve the thermal performance of WLP 40.

Figure 4:
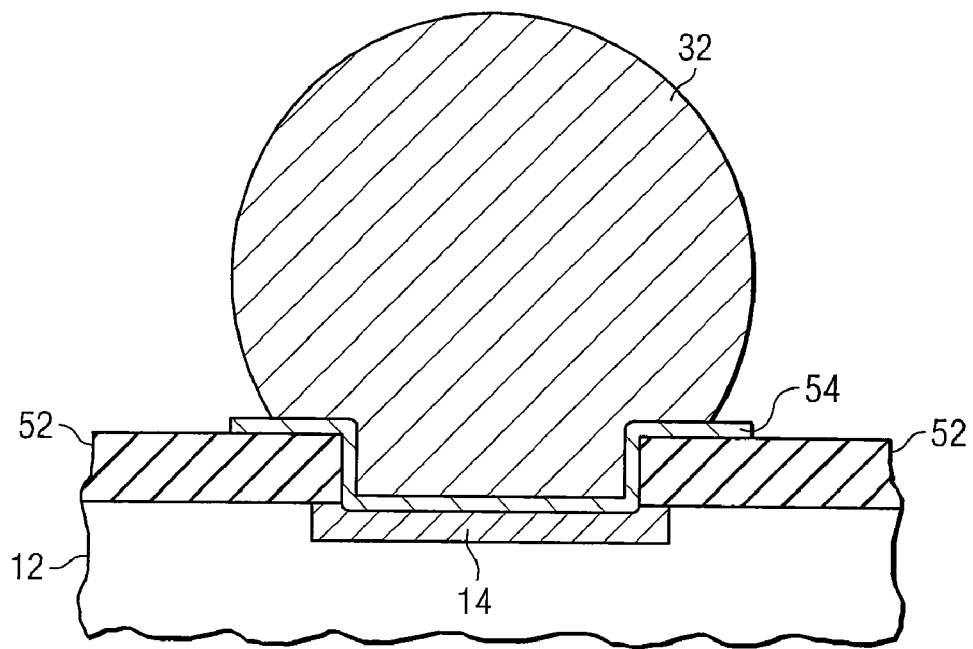
FIG. 4 illustrates further detail of solder bump structure of the shielded WLP.

Further detail of metal contact pad 14 and solder bump 32 are shown in FIG. 4. Metal contact pad 14 is formed on substrate 12. Contact pad 14 is made of aluminum, copper, or aluminum/copper alloys. Contact pad 14 is electrically connected to conduction tracks, and active and passive devices if any, formed on substrate 12. A passivation layer 52 is formed over substrate 12 with an opening to expose metal contact pad 14. The opening is realized by removing a portion of passivation layer 52 through a photoresist mask defined etching process. The first passivation layer 52 can be made with silicon nitride (SiN), silicon dioxide (SiO2), silicon oxynitride (SiON), polyimide, benzocyclobutene (BCB), PolyBenzoxazole (PBO), or other insulating material. An under bump metallization (UBM) layer 54 is formed over passivation layer 52 and contact pad 14. UBM layer 54 can be made with a titanium (Ti) adhesion layer, nickel (Ni) or nickel vanadium (NiV) barrier layer, and copper (Cu) wetting layer. UBM layer 54 acts as an intermediate conductive layer formed between metal contact pad 14 and solder bump 32.

Figure 5:
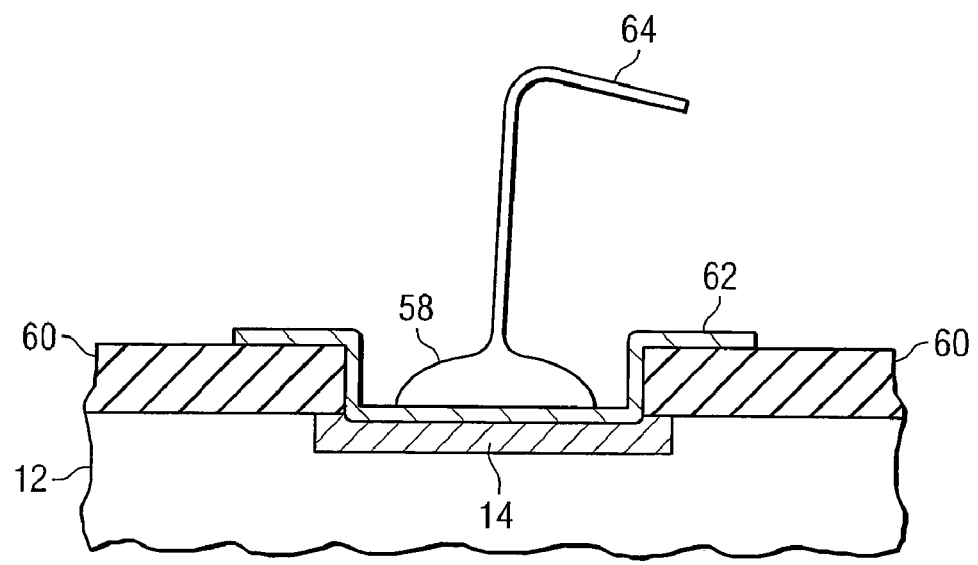
FIG. 5 illustrates a wire bond embodiment for the shielded WLP.

As an alternate interconnect, metal contact pad 14 and wire bond 58 are shown in FIG. 5. Metal contact pad 14 is formed on substrate 12. Contact pad 14 is made of aluminum, copper, or aluminum/copper alloys. Contact pad 14 is electrically connected to conduction tracks, and active and passive devices if any, formed on substrate 12. A passivation layer 60 is formed over substrate 12 with an opening to expose metal contact pad 14. The opening is realized by removing a portion of passivation layer 60 through a photoresist mask defined etching process. The passivation layer 60 can be made with SiN, SiO2, SiON, polyimide, BCB, PBO, or other insulating material. A wire bond layer 62 is formed over passivation layer 60 and contact pad 14. Wire bond layer 62 can be made with Al, Au, Ag, or Pt. Wire bond layer 62 acts as an intermediate conductive layer formed between metal contact pad 14 and wire bond 58. Bond wire 64 connects to wire bond 58.

Figure 6:
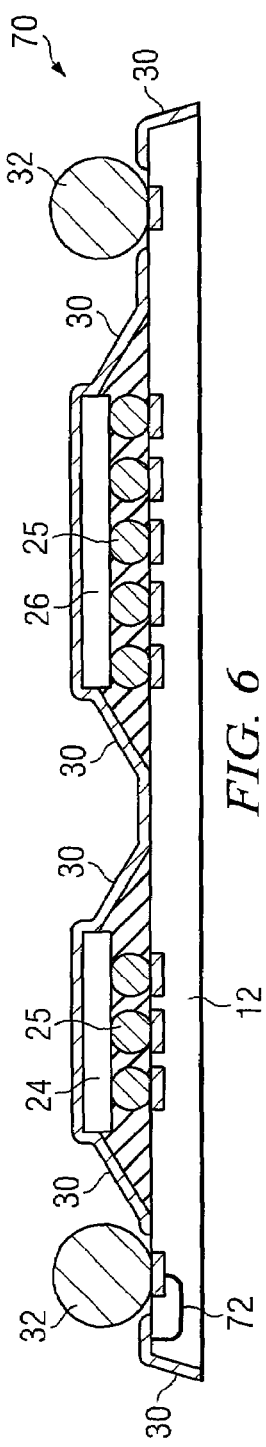
FIG. 6 illustrates the WLP package with EMI shielding on all sides except back side.

FIG. 6 illustrates WLP 70 without backside shielding layer 18. Shielding layer 30 covers substrate 12, RF module 24, and baseband module 26, as shown. The absence of shielding layer 18 simplifies the manufacturing process.

FIG. 6 also shows that shielding layer 30, and likewise shielding layer 18 in FIG. 2c, can be connected to ground potential through redistribution line 72 in substrate 12 and solder ball 32 to further enhance the EMI isolation for baseband module 26.

Figure 7:
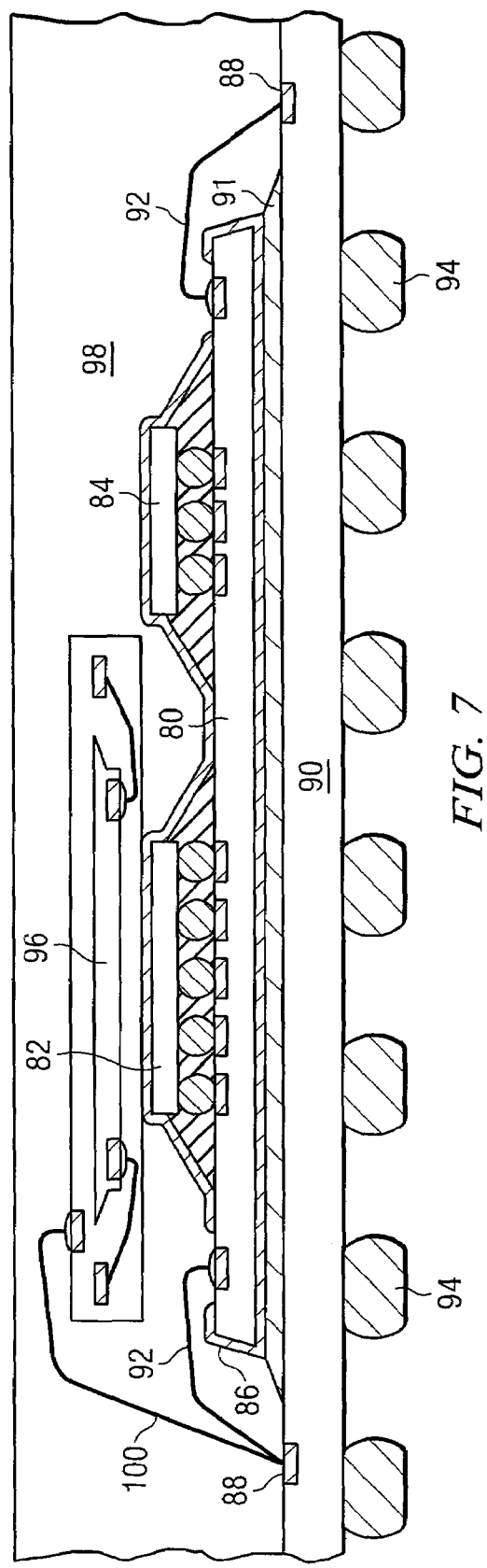
FIG. 7 illustrates a stacked semiconductor package with EMI shielding on all sides of the WLP.

Another embodiment of the shielded WLP is shown in FIG. 7. WLP 80 includes RF module 82 and baseband module 84. WLP 80 is isolated from EMI by shielding layer 86 in the process described for FIGS. 1-3 above. WLP 80 is secured to substrate 90 with a conductive adhesive layer 91. The conductive property of layer 91 can be used to ground shielding layer 86 to enhance the EMI isolation for baseband module 84. Conductive layer 91 eliminates the need for dedicated ground solder bumps or bond wires. WLP 80 electrically connects to contact pads 88 on substrate 90 via bond wires 92. Substrate 90 electrically connects to other platforms, e.g., chip carrier substrate or printed circuit board, via solder bumps 94. WLP 80 is integrated with circuit module 96 in package 98. In one embodiment, circuit module 96 is a memory module. Circuit module 96 is attached to WLP 80 in package 98 and electrically connects to contact pads 88 on substrate 90 via bond wires 100.

While one or more embodiments of the present invention have been illustrated in detail, the skilled artisan will appreciate that modifications and adaptations to those embodiments may be made without departing from the scope of the present invention as set forth in the following claims.

What is claimed is:

1. A wafer level semiconductor package, comprising:
   a substrate;
   a first shielding layer applied to a first surface of the substrate;
   an RF module mounted to a first area on a second surface of the substrate opposite the first surface with a plurality of solder bumps;
   a baseband module mounted to a second area on the second surface of the substrate with a plurality of solder bumps; and
   a second shielding layer covering the second surface of the substrate and RF module and baseband module, wherein the first and second shielding layers substantially cover the wafer level semiconductor package to isolate the baseband module from electromagnetic interference generated by the RF module.

2. The wafer level semiconductor package of claim 1, wherein the first and second shielding layers are made with a material selected from the group consisting of copper, gold, nickel, aluminum, conductive resin, and conductive epoxy.

3. The wafer level semiconductor package of claim 1, wherein the first and second shielding layers are deposited by electrolytic plating or electroless plating.

4. The wafer level semiconductor package of claim 1, further including an underfill material disposed under the RF module and baseband module.

5. The wafer level semiconductor package of claim 1, further including a seed layer deposited on the substrate prior to the second shielding layer.

6. The wafer level semiconductor package of claim 1, wherein the first and second shielding layers are electrically connected and grounded through the substrate.

7. The wafer level semiconductor package of claim 1, further including contact pads formed on the substrate which are devoid of the second shielding layer.

8. A semiconductor package, comprising:
a substrate;
a first electronic module mounted on a first surface of the substrate;
a second electronic module mounted on the first surface of the substrate;
a first shielding layer covering the first surface of the substrate and first and second electronic modules; and
a second shielding layer applied to a second surface of the substrate which is opposite the first surface, wherein the first and second shielding layers substantially cover the semiconductor package to isolate the second electronic module from electromagnetic interference generated by the first electronic module.

9. The semiconductor package of claim 8, wherein the first shielding layer is made with a material selected from the group consisting of copper, gold, nickel, aluminum, conductive resin, and conductive epoxy.

10. The semiconductor package of claim 8, wherein the first shielding layer is deposited by plating.

11. The semiconductor package of claim 8, wherein the first electronic module is an RF module and the second electronic module is a baseband module.

12. The semiconductor package of claim 8, further including a seed layer deposited on the substrate prior to the first shielding layer.

13. The wafer level semiconductor package of claim 8, wherein the first shielding layer is grounded through the substrate.

14. The wafer level semiconductor package of claim 8, further including contact pads formed on the substrate which are devoid of the first shielding layer.

15. A semiconductor package, comprising:
a substrate;
a first electronic module mounted on a first surface of the substrate;
a second electronic module mounted on the first surface of the substrate;
a shielding layer substantially covering the substrate and first and second electronic modules; and
a second shielding layer applied to a second surface of the substrate which is opposite the first surface, wherein the first shielding layer is deposited by plating.

16. The semiconductor package of claim 15, wherein the first shielding layer is made with a material selected from the group consisting of copper, gold, nickel, and aluminum.

17. The semiconductor package of claim 15, wherein the first electronic module is an RF module and the second electronic module is a baseband module.

18. A method of making a semiconductor package, comprising:
forming a substrate;
mounting an RF module on a first surface of the substrate;
mounting a baseband module on the first surface of the substrate;
forming a first shielding layer covering the first surface of the substrate and RF module and baseband module to isolate the baseband module from electromagnetic interference generated by the RF module; and
forming a second shielding layer applied to a second surface of the substrate which is opposite the first surface, wherein the first and second shielding layers substantially cover the semiconductor package.

19. The method of claim 18, wherein the first shielding layer is made with a material selected from the group consisting of copper, gold, nickel, aluminum, conductive resin, and conductive epoxy.

20. The method of claim 18, wherein the first shielding layer is deposited by plating.

21. The method of claim 18, further including disposing an underfill material under the RF module and baseband module.

* * * * *